(12) United States Patent
Chang

(10) Patent No.: US 7,746,130 B2
(45) Date of Patent: Jun. 29, 2010

(54) TRIANGULAR WAVE GENERATING CIRCUIT HAVING SYNCHRONIZATION WITH EXTERNAL CLOCK

(75) Inventor: Chih-Sheng Chang, Tainan County (TW)

(73) Assignee: Elite Semiconductor Memory Technology, Inc., Hsinchu (TW)

( * ) Notice: Subject to any disclaimer, the term of this patent is extended or adjusted under 35 U.S.C. 154(b) by 149 days.

(21) Appl. No.: 12/172,406

(22) Filed: Jul. 14, 2008

(65) Prior Publication Data

US 2010/0007387 A1    Jan. 14, 2010

(51) Int. Cl.
  *H03K 4/06*    (2006.01)
(52) U.S. Cl. ........................ 327/131; 327/137
(58) Field of Classification Search ............. 327/131, 327/132, 135, 137, 140
See application file for complete search history.

(56) References Cited

U.S. PATENT DOCUMENTS

| | | | |
|---|---|---|---|
| 4,240,036 A | 12/1980 | Kohler | |
| 5,077,539 A | 12/1991 | Howatt | |
| 6,211,728 B1 | 4/2001 | Chen et al. | |
| 6,262,632 B1 | 7/2001 | Corsi et al. | |
| 6,545,533 B2 | 4/2003 | Karki et al. | |
| 6,614,297 B2 | 9/2003 | Score et al. | |
| 6,791,405 B2 | 9/2004 | Tsuji et al. | |
| 6,847,257 B2 | 1/2005 | Edwards et al. | |
| 6,956,431 B2 * | 10/2005 | Maejima | 330/10 |
| 7,135,922 B2 | 11/2006 | Zepp | |
| 7,161,421 B2 | 1/2007 | Honda | |
| 7,183,818 B2 * | 2/2007 | Tsuji | 327/132 |
| 7,279,966 B2 | 10/2007 | Krishnan et al. | |
| 7,339,425 B2 | 3/2008 | Yang | |
| 7,403,049 B2 * | 7/2008 | Uchimoto et al. | 327/131 |
| 7,642,820 B2 * | 1/2010 | Chen et al. | 327/131 |
| 2004/0232978 A1 | 11/2004 | Easson et al. | |

* cited by examiner

Primary Examiner—Hai L Nguyen
(74) Attorney, Agent, or Firm—Duane Morris LLP

(57) ABSTRACT

A triangular wave generating circuit includes: an integrating unit including a capacitor, the integrating unit having an output for providing a triangular wave signal; first and second constant current sources for charging and discharging the capacitor; a switch unit for coupling the first and second current sources to the integrating unit to charge and discharge the capacitor in response to an internal clock signal; a high/low level limiter including first and second comparing units for comparing the output of the integrating unit with upper and lower triangular wave peak limit reference voltages, respectively, and providing output signals indicating when the output of the integrating unit coincides with the peak limit reference voltages; a clock generator for providing the internal clock signal in response to the comparing unit output signals; and means for varying a peak-to-peak swing of the triangular wave signal over time to synchronize the internal clock signal with an externally supplied clock pulse.

19 Claims, 9 Drawing Sheets

TRIANGULAR WAVE GENERATING CIRCUIT HAVING SYNCHRONIZATION WITH EXTERNAL CLOCK

FIELD OF THE INVENTION

The present invention relates to triangular wave generating circuits, such as those used in Class-D amplifiers.

BACKGROUND OF THE INVENTION

Triangular wave generating circuits are used in various applications. One common application is for converting an analog audio signal into a pulse signal in a Class-D power amplifier. One such Class-D Audio Amplifier is described in U.S. Pat. No. 6,791,405 to Tsuji et al., entitled "Triangular Wave Generating Circuit Used in Class-D Amplifier" (the "'405 Patent"), the entirety of which is hereby incorporated by reference herein.

FIG. 1 is a circuit diagram illustrating a prior art circuit 10 for forming a triangular wave ($V_{out}$) from a square wave signal. The performance of this triangular wave can seriously influence the accuracy of applications that utilize the triangular wave, such as pulse width modulation (PWM) applications. The switching frequency $f_{SW}$ of the output triangular wave is equal to $1/(T_{up}+T_{down})$ wherein $T_{up}$ is the period of the rise of the triangular wave from $V_L$ to $V_H$ and $T_{down}$ is the period of the falling of the triangular wave from $V_H$ to $V_L$. The "up" period $T_{up}$ is equal to $C*V_{tri,pp}/I_{charge}$, where C is the capacitor C across the operational amplifier 12, $V_{tri,pp}$ is the voltage difference between $V_H$ and $V_L$, and $I_{charge}$ is the charging current from current source $I_1$. Similarly, the "down" period $T_{down}$ is equal to $C*V_{tri,pp}/I_{discharge}$, where $I_{discharge}$ is the discharging current from current source $I_2$ in FIG. 1. Assuming $I_{charge}$ is matched to $I_{discharge}$, then $f_{SW}$ is equal to $I_{charge}/(2*C*V_{tri,pp})$. From this equation, it is known that the switching frequency of the triangular wave is directly proportional to the charge and discharge currents, $I_{charge}$ and $I_{discharge}$, and inversely proportional to the triangular wave swing ($V_{tri,pp}$).

FIG. 2 illustrates potential problems with the triangular wave generators such as the generator 10 of FIG. 1. For example, as shown in "Problem 1" of FIG. 2, the triangular wave does not vary between the desired peak limits $V_H$ and $V_L$ if the current sources are not matched, i.e., if current source I2>I1 or current source I1<I2. Similarly, "Problem 2" illustrates that this same issue arises if the square wave signal does not have an ideal duty cycle. The second problem is frequently found when the internal clock pulse is not synchronized to an external clock source. Synchronizing an internal clock to an external clock is important in, for example, multiple class D amplifier applications, such a 5.1 channel or 7.1 channel audio systems. If the switching frequency is not the same, a beat frequency will occur in the audio band.

The '405 Patent discussed above teaches a method of providing synchronization with an external clock to form a triangular wave. The method of the '405 Patent achieves synchronization between and internal clock signal and an externally provided clock signal by varying the triangular wave slope, i.e., by varying the charge/discharge currents. However, in class-D amplifiers, the audio quality is affected by the slope of the triangular wave. Once the slope of the triangular wave becomes smaller than the slope of the amplifier's integrator output, the audio quality becomes worse.

Improved triangular wave generators are desired.

SUMMARY OF THE INVENTION

A triangular wave generating circuit includes: an integrating unit including a capacitor, the integrating unit having an output for providing a triangular wave signal; first and second constant current sources for charging and discharging the capacitor; a switch unit for coupling the first and second current sources to the integrating unit to charge and discharge the capacitor in response to an internal clock signal; a high/low level limiter including first and second comparing units for comparing the output of the integrating unit with upper and lower triangular wave peak limit reference voltages, respectively, and providing output signals indicating when the output of the integrating unit coincides with the peak limit reference voltages; a clock generator for providing the internal clock signal in response to the comparing unit output signals; and means for varying a peak-to-peak swing of the triangular wave signal over time to synchronize the internal clock signal with an externally supplied clock pulse.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

The present invention relates to triangular wave generating circuits. One common application of these circuits is converting an analog audio signal into a pulse signal in a Class-D power amplifier. Exemplary Class-D audio amplifiers are described in co-pending and commonly assigned U.S. patent application Ser. No. 11/462,166 entitled "Class-D Audio Amplifier with Half-Swing Pulse Width Modulation" filed Aug. 3, 2006, now U.S. Pat. No. 7,339,425, the entirety of which is hereby incorporated by reference herein (hereinafter, the '425 Patent). Other examples of Class-D Audio Amplifiers are also described in the '405 Patent to Tsuji et al.

Figure 1:
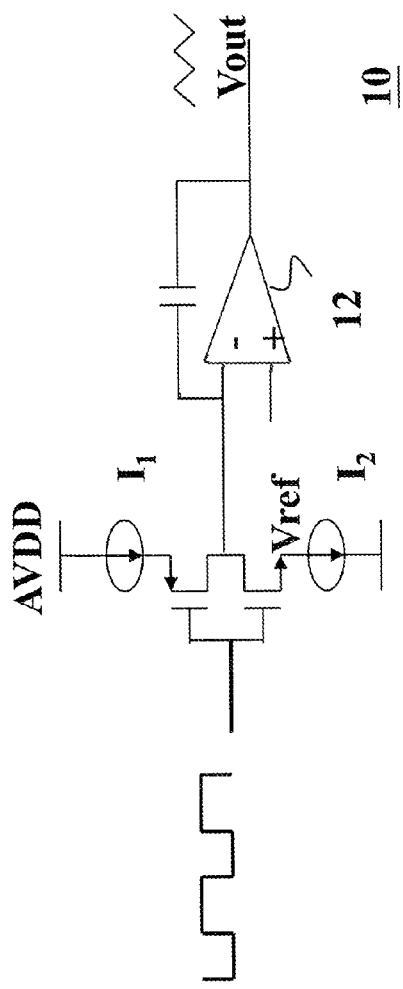
FIG. 1 is circuit diagram of a prior art triangular wave signal generator.
Figure 2:
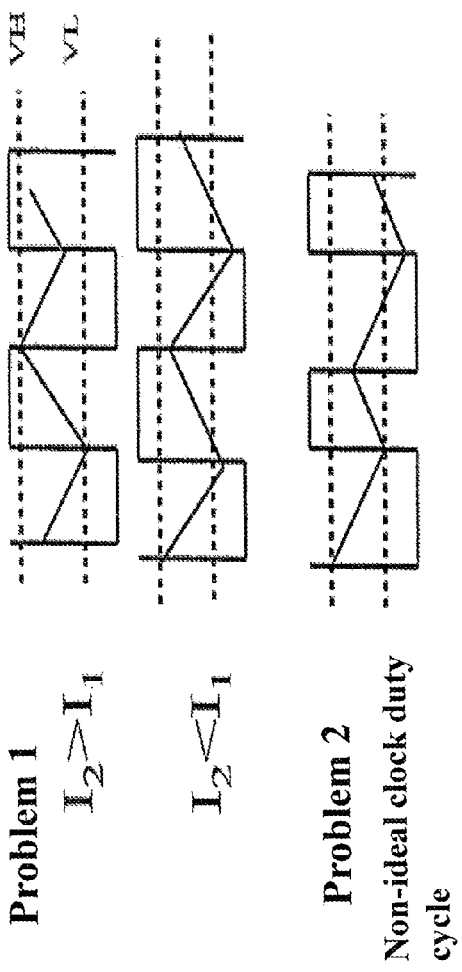
FIG. 2 illustrates various problems with prior art triangular wave generators.
Figure 3A:
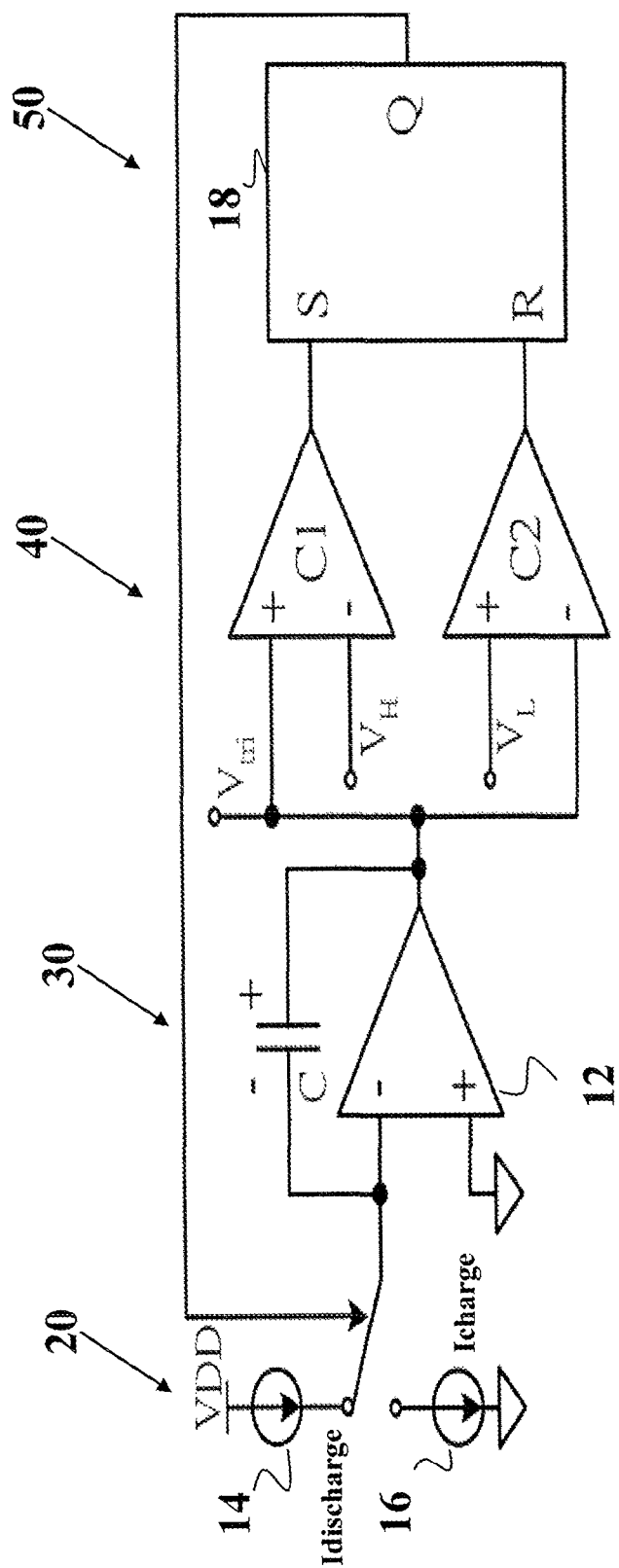
FIGS. 3A and 3B illustrate the operation of a prior art triangular wave signal generator in response to an internal clock signal.
Figure 3B:
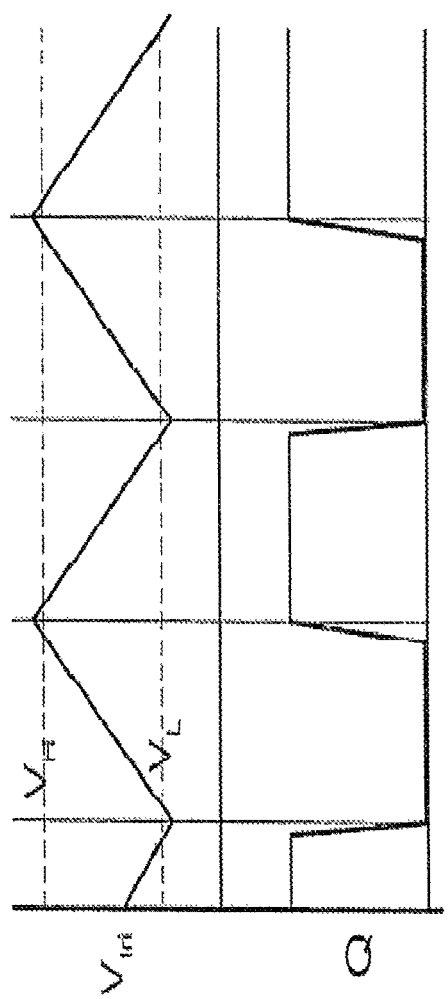

The operational principle of the triangular wave generator is illustrated in connection with the prior art triangular wave generator 10A shown in FIG. 3A. The triangular wave generator 10A includes four basic stages that operate together to form the triangular wave $V_{tri}$ shown in the graph of FIG. 3B. The generator 10A includes a current source stage 20 including the first current source 14 and the second current source 16, an integrating circuit 30 including an operational amplifier 12 having a capacitor C coupled between an input and an output of the operational amplifier 12, a high/low level limiter 40 comprising a pair of comparators C1, C2, and a switch unit 50 including a flip flop 18. FIG. 3B shows the relationship between the output triangular wave $V_{tri}$ and signal Q. In the illustrated circuit 10, the integrator 30 is an inverted integrator. When signal Q is high, the capacitor C is discharged by constant current $I_{discharge}$ from current source 14, and $V_{tri}$ goes down. Once $V_{tri}$ is less than $V_L$, Q changes to a low state from its high state. With Q at a low state, capacitor C is charged by constant current $I_{charge}$ from current source 16, and $V_{tri}$ goes up. Once $V_{tri}$ is larger than $V_H$, Q changes to high state from its low state.

The triangular wave generator described herein is capable of synchronizing with an externally provided clock pulse signal to limit the triangular signal between desired high and low peak-to-peak limits when synchronizing to an external clock signal. As described in detail below, the triangular wave generator synchronizes an internal clock signal with the externally provided clock signal by selectively varying the limits of the swing ($V_{tri,pp}$) of the triangular wave generator. With the approach of the present invention, the slope of the rise (upswing) and fall (downswing) of signal $V_{tri}$ is constant and only the peak of the triangular wave signal is changed in order to obtain synchronization. As discussed in the Background section the slope of the triangular wave influences audio output quality in class D-amplifier implementations. This is a concern with the prior art design of the '405 Patent to Tsuji et al. but not with the triangle wave generating circuit and methodology described herein.

Figure 4:
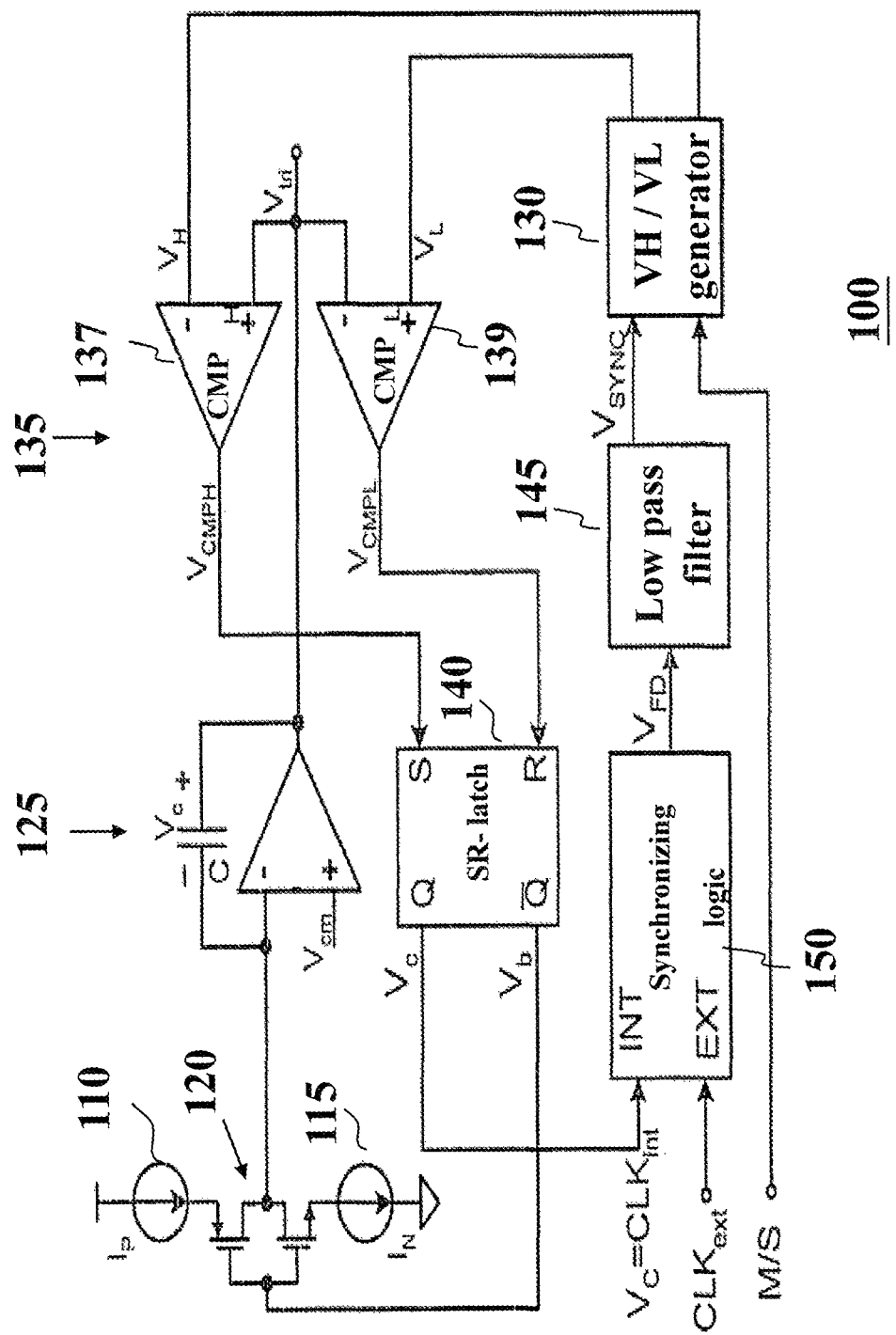
FIG. 4 is a block diagram a triangular wave generator according to an embodiment of the present invention.

FIG. 4 is a circuit diagram of a triangular wave generator 100 for generating triangular wave $V_{tri}$ according to an embodiment of the present invention. As with the prior art triangular wave generators discussed above, the triangular wave generator 100 includes a pair of matching charge/discharge current sources 115, 110, a switch unit 120, which may comprise a transistor pair, for selecting one of the current sources 110, 115, and an integrating circuit 125, shown as an inverted integrator comprising an operational amplifier and a capacitor. Signal $V_{cm}$ provided to the operational amplifier of the integrator 125 is set to a constant reference voltage, such as VDD/2. The embodiment shown in FIG. 4 also includes a high/low level limiter circuit 135 including a pair of comparators 137, 139, and a $V_H/V_L$ generator unit 130 which provides upper and lower triangular wave peak limit reference voltages to the comparators 137, 139 to set the upper and lower limits of the triangular wave $V_{tri}$. The $V_H/V_L$ generator unit 130 receives a Master/Slave mode selector control signal M/S and a synchronization voltage signal ($V_{SYNC}$), as described in more detail below, as inputs. As with generator 10A in FIG. 3A, the output voltage $V_{CMPH}$ of the comparator 137 and the output voltage $V_{CMPL}$ of the comparator 139 are provided to an internal clock generator circuit 140, which, in the illustrated embodiment, includes a SR latch. The clock generator 140 provides the first internal clock singal Vb for controlling switching unit 120 and the second internal clock signal Vc ($CLK_{int}$), which is the inversion of signal Vb. The triangular wave generator 100 also includes a synchronizing logic module 150 and a low-pass filter 145.

If signal M/S is high, the generator unit 130 causes the triangular wave generator 100 to operate in the master mode, i.e., closed loop mode, and if signal M/S is low, the generator unit 130 causes the triangular wave generator 100 to operate in the slave mode, i.e., to synchronize to an external clock $CLK_{ext}$. The voltage signal $V_{FD}$ represents the phase difference between the internal clock $CLK_{int}$, which is the inverted signal of clock Vb, and the external clock $CLK_{ext}$. $V_{SYNC}$ is a filtered version of difference signal $V_{FD}$, specifically with high frequency components removed. Signal $V_{SYNC}$ is provided to the generator unit 130 and is used as an upper limit of the triangular wave $V_{tri}$ when the slave mode is enabled by control signal M/S.

Figure 5:
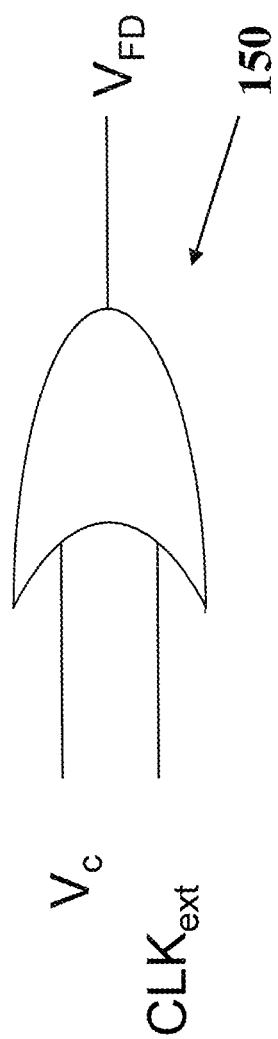
FIG. 5 illustrates an embodiment of a synchronizing circuit for use in the triangular wave generator of FIG. 4.

FIG. 5 illustrates an embodiment of the synchronizing logic module 150. The synchronizing logic module 150 performs an OR function on the internal clock signal Vc and the externally provided clock pulse signal $CLK_{ext}$. In the illustrated embodiment, the synchronizing logic module includes an OR gate with inputs Vc and $CLK_{ext}$ and provides output $V_{FD}$. The synchronizing logic module 150 provides $V_{FD}$ low only when both Vc and $CLK_{ext}$ are low. Alternative logic structures for implementing the OR function will be apparent to those familiar with logic designs.

Figure 6:
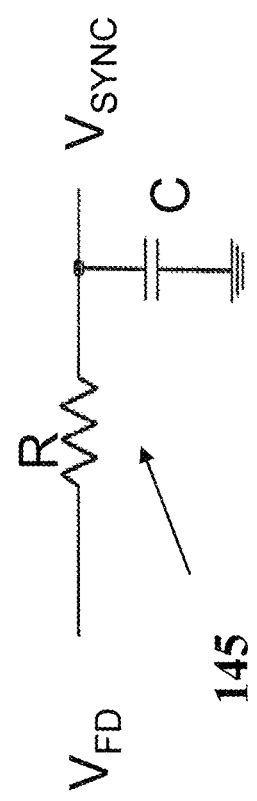
FIG. 6 illustrates an embodiment of a low pass filter for use in the triangular wave generator of FIG. 4.

FIG. 6 illustrates an embodiment of the low pass filter 145, more specifically an RC low pass filter. The low pass filter 145 is capable of ignoring transient spikes caused by undesired interference, such as static charge. In operation, the external clock $CLK_{ext}$ does not always have a 50% duty cycle, and at time may have a short pulse. To ensure that the circuit operates normally under these conditions, the shortest pulse width of the external clock $CLK_{ext}$ should have a minimum width, for example, larger than 0.7 R*C.

The operation of the triangular wave generator of FIG. 4 is now described. Signal Vc, which is also labeled $CLK_{int}$ in FIG. 4, represents the frequency and phase of the triangular wave $V_{tri}$. The synchronizing logic 150 compares $CLK_{int}$ with the external clock $CLK_{ext}$ to generate pulse-type difference signal $V_{FD}$. After low pass filtering by low pass filter 145, pulse signal $V_{FD}$ becomes $V_{SYNC}$ and has a slope like characteristic when $V_{FD}$ is low. Assuming the generator unit 130 is set to slave mode by signal M/S, the upper peak limit reference voltage $V_H$ is set to $V_{SYNC}$ by generator unit 130 to dynamically control the upper peak limit to obtain synchronization with the external clock pulse $CLK_{ext}$. It should be apparent that if $V_H$ or $V_L$ is changed, the frequency of the triangular wave $V_{tri}$ is changed. The adjustment will continue until $CLK_{int}$ and $CLK_{ext}$ are inversely synchronized with phase shift, that is until $V_{FD}$ is a fixed-width pulse. In this embodiment, the generator unit 130 does not utilize a fixed voltage for the upper peak limit reference voltage $V_H$ but rather dynamically adjusts it over time by setting it to variable signal $V_{SYNC}$ to adjust the triangular wave frequency while using a fixed lower limit for $V_L$. The voltage generator unit 130 operates to set the triangular wave peak limit reference voltage $V_H$ to one of a predetermined fixed $V_H$ and $V_{SYNC}$ depending on the operational mode set by the control signal M/S. In an alternative embodiment, the lower limit of the triangular wave ($V_L$) is adjusted to adjust the triangular wave frequency while maintaining a fixed upper limit for $V_H$.

A brief explanation of the operation of the generation of the triangular wave $V_{tri}$ is helpful in understanding the operation of the voltage generator unit 130. The charge/discharge current sources 115, 110 are controlled by the internal clock signal Vb. If the clock signal Vb is high, the capacitor C charges until $V_{tri}$ is larger than the value of reference voltage $V_H$. Once $V_{tri}$ is larger than the value set for $V_H$, Vb goes low and the capacitor discharges until $V_{tri}$ is lower than the value of $V_L$. In master mode, as determined by signal M/S, the upper peak limit reference voltage for the triangular wave is set a fixed high reference voltage. This fixed voltage represents the upper peak limit for the signal $V_{tri}$. Lower peak limit reference voltage $V_L$ is a fixed reference voltage and sets the low peak limit for the signal $V_{tri}$. If the system is in slave mode as set by the signal M/S, the lower limit is again set to the fixed low reference voltage $V_L$. However, in slave mode, the upper peak limit reference voltage $V_H$ is set to synchronizing voltage $V_{SYNC}$, which can be changed from clock period to clock period depending on changed in difference voltage signal $V_{FD}$. Voltage $V_{SYNC}$, therefore, is not fixed. Once synchronization occurs, the low pulse width of $V_{FD}$ becomes fixed and $V_{tri,pp}$ settles at a constant voltage.

Figure 7:
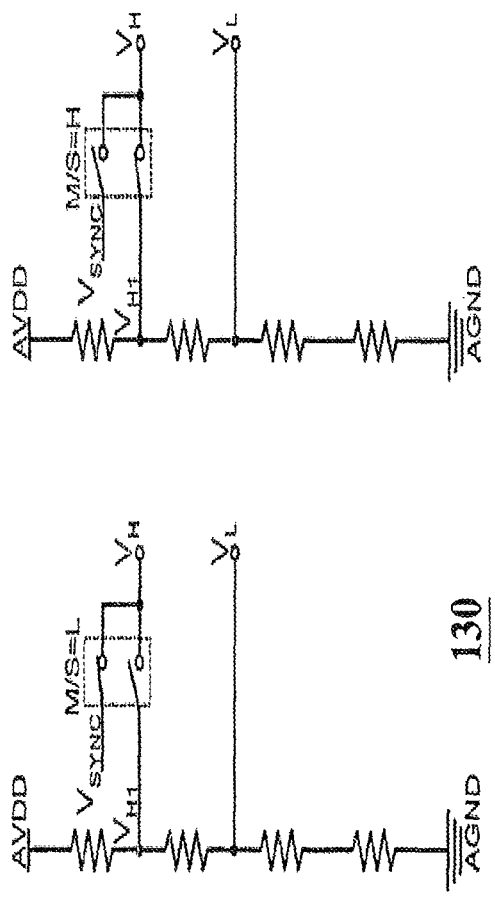
FIG. 7 illustrates an embodiment of the $V_H/V_L$ generator module of the triangular wave generator FIG. 4.

FIG. 7 is a circuit diagram of the VH/VL generator unit 130. As shown in FIG. 7, the generator unit 130 includes a resistive ladder for providing constant reference voltages $V_L$ and $V_{H1}$. Output $V_H$ is selectively coupled through a switch to either $V_{H1}$ or $V_{SYNC}$ under control of signal M/S. When M/S is low (i.e., slave mode), $V_H$ is set to $V_{SYNC}$ and when M/S is high (i.e., master mode), $V_H$ is set to $V_{H1}$.

Figure 7A:
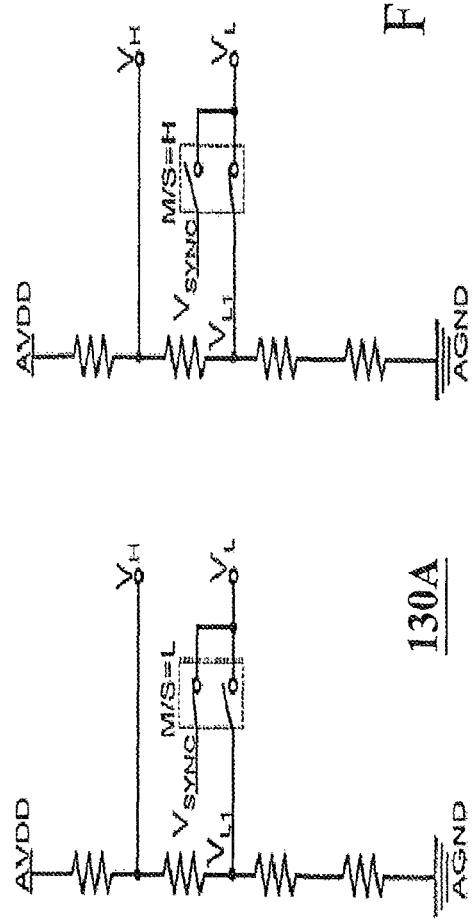
FIG. 7A illustrates an alternative embodiment of the generator module shown in FIG. 7.

Although the above-described embodiment dynamically adjusts the upper limit of the triangular wave ($V_H$) from clock period to clock period by setting it to variable voltage signal $V_{SYNC}$ to adjust the triangular wave frequency, it is also possible as discussed above to adjust the lower limit of the triangular wave ($V_L$) to adjust the triangular wave frequency. In such an embodiment, the upper limit $V_H$ is fixed in both master and slave modes and the logic of the synchronizing logic 150 and the voltage generator unit 130 are modified accordingly. For example, the OR gate of FIG. 6 is replaced with an AND gate and the voltage generator unit is configured as unit 130A shown in FIG. 7A.

Figure 8A:
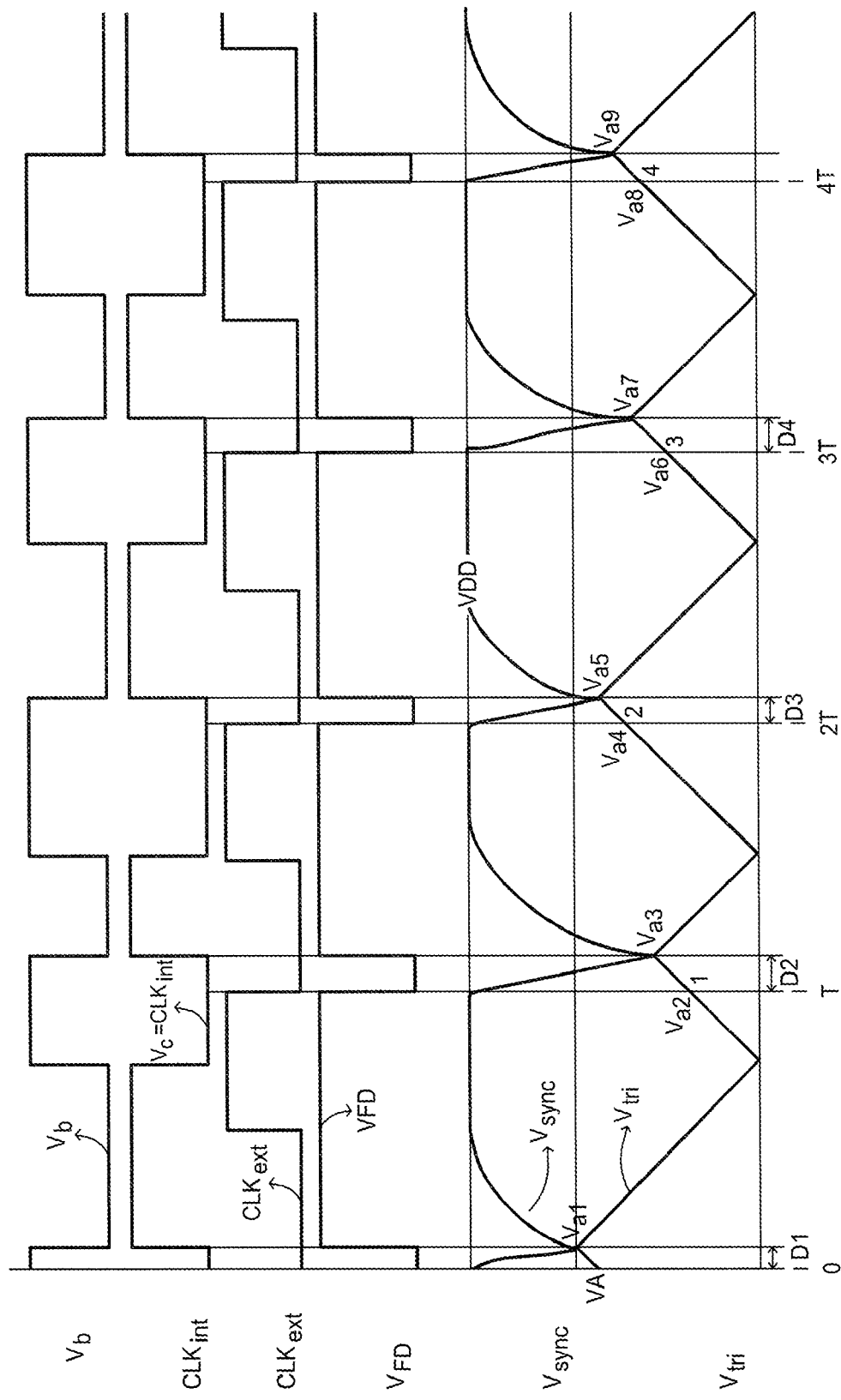
FIGS. 8A and 8B are timing diagrams illustrating the operation of the triangular wave generator of FIG. 4.

FIG. 8A is a timing diagram further illustrating the operation of the triangular wave generator circuit 100 in slave mode. In this mode, the voltage $V_L$ is set to a constant lower limit reference voltage and the upper limit reference voltage $V_H$ is set to $V_{SYNC}$. When t=0, $V_{FD}$ changes to low and $V_{tri}=VA$, which is the initial condition of $V_{tri}$. From t=[0~D1], because Vb is high, the capacitor C is charged and $V_{tri}$ goes up. Because the circuit is in slave mode, $V_H$ is set to $V_{SYNC}$ by the generator module 130. At the same time, $V_{SYNC}$ falls from VDD until $V_{tri}=V_H=V_{SYNC}=V_{a1}$ at time D1. Then, at time D1, Vb changes from high to low and $V_{FD}$ changes to high, because Vc is high.

From the time interval t=[D1~T], $V_{tri}$ falls down to the constant value $V_L$ and then goes up. At the time when $V_{tri}$ changes from falling to rising, Vb changes from low to high. When Vb is low, the triangular wave falls towards predetermined low voltage $V_L$. When Vb is high, the triangular wave begins to rise to the reference voltage set by $V_H$. At time t=T, $V_{tri}$ is at a voltage level $V_{a2}$ and $V_{FD}$ changes to low again because both Vc and $CLK_{ext}$ are low. Because $V_{a2}$ is less than $V_{SYNC}$ at this point, the triangular wave continues to rise. T is the period of external clock $CLK_{ext}$.

During the time period from t=[T~T+D2], Vb is still at high state and $V_{tri}$ goes up. At time t=T, $V_{SYNC}$ starts to fall from VDD until $V_{tri}=V_H=V_{SYNC}=V_{a3}$ at time t=T+D2. Then, Vb changes from high to low and $V_{FD}$ changes to high again.

During the time interval from time t=[T+D2~2T], $V_{tri}$ falls down to $V_L$ and then goes up. At the time when $V_{tri}$ changes from falling down to going up, Vb changes from low to high. At time t=2T, Vtri is charged to voltage level $V_{a4}$ and $V_{FD}$ changes to low again.

During the time interval from time t=[2T~2T+D3], Vb is still at high state and $V_{tri}$ continues to rise. At time t=2T, Vsync starts to fall from VDD until $V_{tri}=V_{SYNC}=V_{a5}$ at time t=2T+D3. Then, Vb changes from high to low and $V_{FD}$ changes to high again.

During the time interval from time t=[2T+D3~3T], $V_{tri}$ falls down to $V_L$ and then goes up. At the time when $V_{tri}$ changes from falling down to going up, Vb changes from low to high. At t=3T, Vtri is charged to $V_{a6}$ and $V_{FD}$ changes to low again.

During the time interval from time t=[3T~3T+D4], Vb is still at high state and $V_{tri}$ goes up. At time t=3T, $V_{SYNC}$ starts to fall from VDD until $V_{tri}=V_{SYNC}=V_{a7}$ at time t=3T+D4. Then, Vb changes from high to low and $V_{FD}$ changes to high again.

During time interval t=[3T+D4~4T], $V_{tri}$ falls down to $V_L$ and then goes up. At the time when $V_{tri}$ changes from falling down to going up, Vb changes from low to high. At t=4T, $V_{tri}$ is charged to voltage level $V_{a8}$ and $V_{FD}$ changes to low again.

From the waveform shown in FIG. 8A, it can be seen that the difference between $V_{a3}$ and $V_{a5}$ is smaller than the difference between $V_{a1}$ and $V_{a3}$. Indeed, the $V_{tri}$ waveform conforms to the following equation: $|V_{a1}-V_{a3}|>|V_{a3}-V_{a5}|>|V_{a5}-V_{a7}|> \ldots >|V_{a(2x-1)}-V_{a(2x+1)}|$. When "x" approaches infinity, $|V_{a(2x-1)}-V_{a(2x+1)}|$ approaches 0 and $V_{a(2x+1)}=V_L+(T*Slope_{tri})/2$. Assuming the rising and falling slope of the triangular wave generator is the same ($Slope_{tri}$), and that the period of the external clock is T and the low limit of the triangular wave is $V_L$, then the expected upper peak of triangular wave generator is $V_{tri,upper}=V_L+(0.5T)*Slope_{tri}$ and the frequency is 1/T.

Figure 8B:
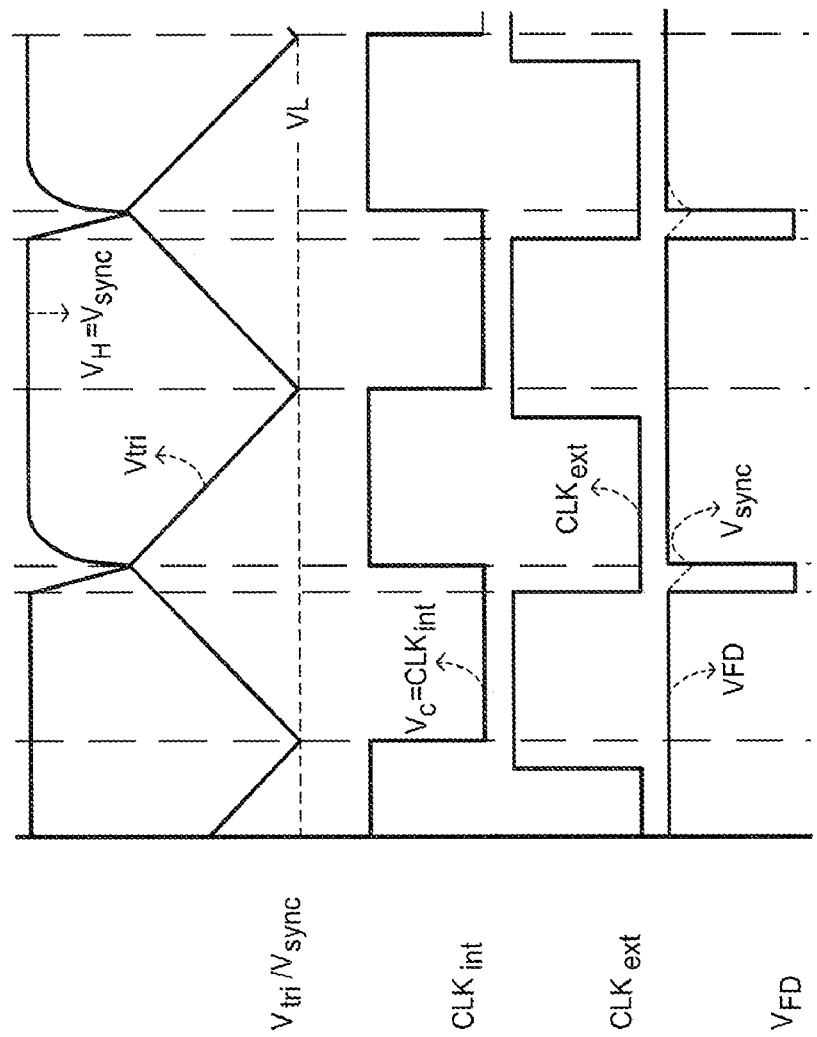

FIG. 8B is a timing diagram showing signal $V_{FD}$, $CLK_{int}$, $CLK_{ext}$, $V_{tri}$, and $V_{SYNC}$ at steady state after the synchronization has been achieved. When the circuit is stable, Vc (i.e., $CLK_{int}$) is always slightly behind $CLK_{ext}$ and the triangular wave Vtri settles at a consistent peak to peak-to-peak voltage, i.e., the upper peak is no longer varied to obtain synchronization.

Figure 9:
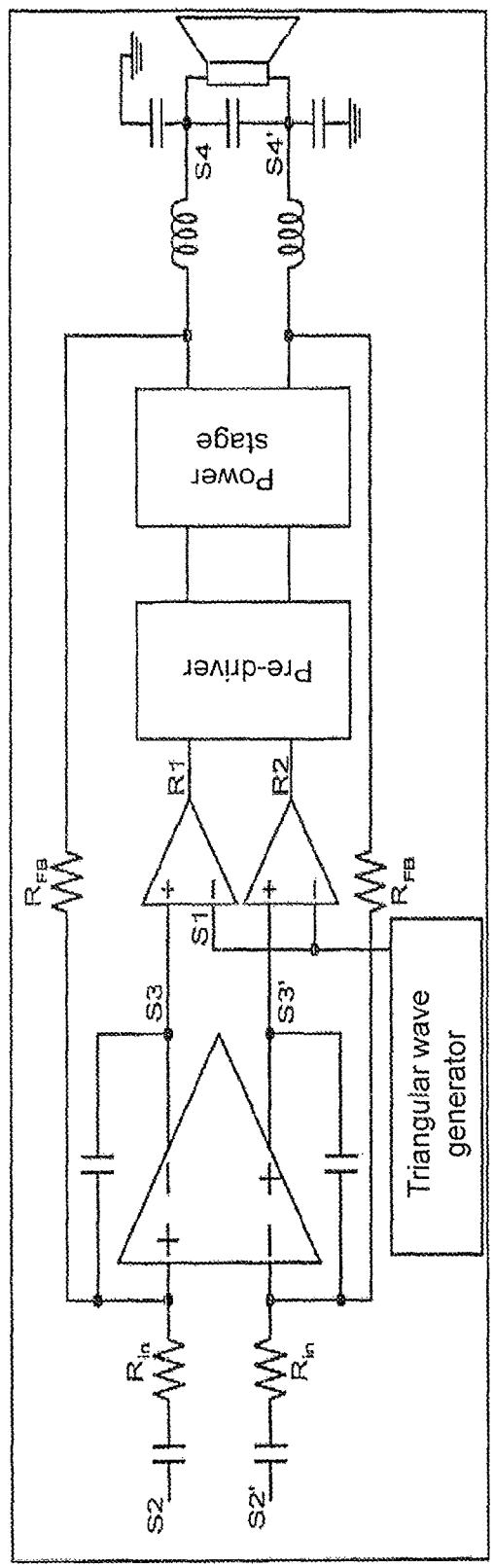
FIG. 9 is a diagram of a Class D audio amplifier with which the triangular wave generator of FIG. 4 may be used.

In exemplary embodiments, the triangular wave generator 100 described above can be used as the triangular wave generator for a Class D Audio Amplifier, such as shown in FIG. 9 and described in detail in the '425 Patent. As shown in FIG. 9 and described in the '425 Patent, Class D amplifiers have a triangular wave generator, a modulation stage which generate the pulse-width-modulates (PWM) waveform from the input signal by using a triangular wave output from the triangular wave generating circuit, and a switching amplification output stage for amplification of an output of the modulation stage.

As described herein, a triangular wave generator includes the structure for varying the peak-to-peak swing of the triangle wave by dynamically controlling at least one of the upper and lower peak limit reference voltages used in setting the peak-to-peak values of the triangle wave. In embodiments, the reference voltage is set to a synchronization voltage that varies period-to-period dependent on the level of synchronization between the internal and external clock signal. In some embodiments, a voltage generator sets the reference voltage to the synchronization voltage or to a constant reference voltage dependent on the mode of the generator. The variable synchronization voltage can be provided by a synchronization circuit and low pass filter.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A triangular wave generating circuit, comprising:
   an integrating unit including a capacitor, the integrating unit having an output for providing a triangular wave signal;
   first and second constant current sources for charging and discharging the capacitor;
   a switch unit for coupling the first and second current sources to the integrating unit to charge and discharge the capacitor in response to an internal clock signal;
   a high/low level limiter including first and second comparing units for comparing the output of the integrating unit with upper and lower triangular wave peak limit reference voltages, respectively, and providing output signals indicating when the output of the integrating unit coincides with the peak limit reference voltages;
   a clock generator for providing the internal clock signal in response to the comparing unit output signals; and
   means for varying a peak-to-peak swing of the triangular wave signal over time to synchronize the internal clock signal with an externally supplied clock pulse.

2. The triangular wave generating circuit of claim 1, wherein the upper and lower triangular wave peak limit reference voltages set the upper and lower limits for the peak to peak swing of the triangular wave signal and wherein the varying means varies the peak to peak swing of the triangular wave signal by setting one of the triangular wave peak limit reference voltages to a variable voltage.

3. The triangular wave generating circuit of claim 2, wherein the varying means comprises a reference voltage generator unit, the reference voltage generator unit setting the one of the triangular wave peak limit reference voltages to either a predetermined voltage level or to a synchronization voltage signal in response to a control signal.

4. The triangular wave generating circuit of claim 3, wherein the varying means further comprises:
   a synchronizing unit for comparing the externally supplied clock pulse with the internal clock signal and providing a voltage signal representative of a phase difference between the externally supplied clock pulse and the internal clock signal; and
   a low-pass filter for filtering the voltage signal to provide the synchronization voltage signal.

5. The triangular wave generating circuit of claim 4, wherein the synchronizing unit performs an OR function on the externally supplied clock pulse and the internal clock signal, and the one of the triangular wave peak limit reference voltages is the upper peak limit reference voltage.

6. The triangular wave generating circuit of claim 4, wherein the synchronizing unit performs an AND function on the externally supplied clock pulse and the internal clock signal, and the one of the triangular wave peak limit reference voltages is the lower peak limit reference voltage.

7. The triangular wave generating circuit of claim 1, wherein the triangular wave generating circuit is configured to operate in master or slave mode responsive to a master/slave mode control signal, wherein in the master mode the upper and lower triangular wave peak limit reference voltages are both set to fixed reference voltages and in the slave mode the varying means sets one of the upper and lower triangular wave peak limit reference voltages to a variable voltage.

8. The triangular wave generating circuit of claim 1, wherein the integrating unit further comprises an amplifier and the capacitor is coupled between an input terminal and an output terminal of the amplifier.

9. A triangular wave generating circuit comprising:
   an integrating unit including an amplifier and a capacitor coupled between an input terminal and an output terminal of the amplifier, the integrating unit providing a triangular wave signal at its output terminal;
   first and second constant current sources for charging and discharging the capacitor;
   a switch unit for coupling of the first and second current sources to the integrating unit to charge and discharge the capacitor in response to an internal clock signal;
   a high/low level limiter comprising a pair of comparators for comparing the output of the integrating unit with upper and lower triangular wave peak limit reference voltages, respectively, and outputting signals indicating when the output of the amplifier coincides with the triangular wave peak limit reference voltages;
   a clock generation unit for providing the internal clock signal in response to the output signals of the comparing unit;
   a synchronizing unit for providing a voltage signal representative of the phase difference between the externally supplied clock pulse and the internal clock signal;
   a low-pass filter for filtering the voltage signal to provide a synchronization voltage signal; and
   a reference voltage generator for setting the upper and lower triangular wave peak limit reference voltages to vary a peak to peak swing of the triangular wave signal over time to synchronize the internal clock signal with the externally supplied clock pulse, the reference voltage generator unit setting one of the upper and lower triangular wave peak limit reference voltages to a constant voltage level and the other of the triangular wave peak limit reference voltages to a synchronization voltage.

10. The triangular wave generating circuit of claim 9, wherein the upper triangular wave peak limit reference voltage is set to the synchronization voltage.

11. The triangular wave generating circuit of claim 10, wherein the synchronizing unit performs an OR function on the externally supplied clock pulse and an inverted version of the internal clock signal.

12. The triangular wave generating circuit of claim 9, wherein the triangular wave generating circuit is configured to operates in master or slave mode responsive to a master/slave mode control signal.

13. A Class-D amplifier comprising:
   a modulation stage which generates a pulse-width-modulates (PWM) waveform from an input signal using a triangular wave output from a triangular wave generating circuit; and
   an output amplification stage for amplification of an output of the modulation stage, wherein the triangular wave generating circuit comprises:
     an integrating unit including a capacitor, the integrating unit having an output for providing a triangular wave signal;
     first and second constant current sources for charging and discharging the capacitor;
     a switch unit for coupling the first and second current sources to the integrating unit to charge and discharge the capacitor in response to an internal clock signal;
     a comparing unit which compares the output of the integrating unit with upper and lower triangular wave peak limit reference voltages and outputs signals when the output of the integrating unit coincides with the triangular wave peak limit reference voltages;

a clock generation unit for providing the internal clock signal in response to the comparing unit output signal; and means for varying a peak to peak swing of the triangular wave signal over time to synchronize the internal clock signal with an externally supplied clock pulse.

14. The Class-D amplifier of claim 13, wherein the upper and lower triangular wave peak limit reference voltages set the upper and lower limits for the peak to peak swing of the triangular wave signal and wherein the varying means varies the peak to peak swing of the triangular wave signal by controlling one of the triangular wave peak limit reference voltages.

15. The Class-D amplifier of claim 14, wherein the varying means comprises a reference voltage generator, the reference voltage generator setting the one of the triangular wave peak limit reference voltages to either a predetermined voltage level or to a synchronization voltage signal in response to a control signal.

16. The Class-D amplifier of claim 15, wherein the varying means further comprises:

a synchronizing unit for comparing the externally supplied clock pulse with the internal clock signal and providing a voltage signal representative of a phase differences between the externally supplied clock pulse and the internal clock signal; and a low-pass filter for filtering the voltage signal to provide the synchronization voltage signal.

17. The Class-D amplifier of claim 16, wherein the synchronizing unit performs an OR function on the externally supplied clock pulse and an inverted version of the internal clock signal.

18. A method of synchronizing an internal clock signal used in a triangular wave generating circuit with an externally provided clock pulse signal, wherein the triangular wave generating circuit charges and discharges a capacitor of an integrating unit in response to the internal clock signal to provide a triangle wave signal, the method comprising the steps of:

varying a peak to peak swing of the triangular wave signal over time to synchronize the internal clock signal with an externally supplied clock pulse.

19. The method of claim 18, further comprising the steps of:

comparing the internal clock signal with the externally provided clock pulse signal to provide a voltage signal representative of phase differences between the internal clock signal and the externally provided clock pulse signal;

filtering the voltage signal to remove high frequency components thereof, thereby providing a synchronization voltage signal; and comparing the triangular wave signal with upper and lower triangular wave peak limit reference voltages to produce the internal clock signal, wherein one of the upper and lower triangular wave peak limit reference voltages is set to said synchronization voltage signal, whereby the peak-to-peak swing of the triangular wave signal is varied.

* * * * *